(12) United States Patent
Lau

(10) Patent No.: US 8,159,304 B1
(45) Date of Patent: Apr. 17, 2012

(54) APPARATUS AND METHOD FOR FEED-FORWARDING IN A CURRENT-FEEDBACK AMPLIFIER

(75) Inventor: Kwok Kit Lau, Hong Kong (CN)

(73) Assignee: National Semiconductor Corporation, Santa Clara, CA (US)

( * ) Notice: Subject to any disclaimer, the term of this patent is extended or adjusted under 35 U.S.C. 154(b) by 80 days.

(21) Appl. No.: 12/173,760

(22) Filed: Jul. 15, 2008

(51) Int. Cl.
*H03F 3/04* (2006.01)
*H03F 3/26* (2006.01)

(52) U.S. Cl. ........................ 330/297; 330/267

(58) Field of Classification Search ............... 330/252, 330/257–258
See application file for complete search history.

(56) References Cited

U.S. PATENT DOCUMENTS

| | | | | |
|---|---|---|---|---|
| 5,578,967 A | * | 11/1996 | Harvey | 330/263 |
| 5,592,124 A | * | 1/1997 | Mullins et al. | 330/308 |
| 6,043,718 A | | 3/2000 | Diniz et al. | |
| 6,278,326 B1 | * | 8/2001 | Murray et al. | 330/288 |
| 6,724,260 B2 | * | 4/2004 | Varner et al. | 330/288 |
| 7,078,973 B2 | * | 7/2006 | Alenin | 330/263 |
| 2006/0055383 A1 | | 3/2006 | Eberlein | |

OTHER PUBLICATIONS

Harvey, B., "Practical Current Feedback Amplifier Design Considerations," Intersil Americas Inc., Mar. 24, 1998, AN1106, pp. 1-7.
"An Intuitive Approach to Understanding Current Feedback Amplifiers," Intersil Americas Inc., Oct. 11, 2004, AN9787.1, pp. 1-4.
Harvey, B., "Current Feedback Opamp Limitations: A State-Of-The-Art Review," Elantec Inc., pp. 1066-1069 (1993).
Bowers, D.F., "The So-Called Current-Feedback Operational Amplifier- Technological Breakthrough or Engineering Curiosity?," Analog Devices Inc. (PMI Division), pp. 1054-1057 (1993).
Smith, S. O., "The Good, the Bad and the Ugly: Current Feedback-Technical Contributions and Limitations," Comlinear Corporation, pp. 1058-1061 (1993).
LME49713, "High Performance, High Fidelity Current Feedback Audio Operational Amplifier," National Semiconductor Corporation, Jan. 29, 2008, pp. 1-14.

* cited by examiner

*Primary Examiner* — Robert Pascal
*Assistant Examiner* — Khiem Nguyen
(74) *Attorney, Agent, or Firm* — Frommer Lawrence & Haug LLP; Matthew M. Gaffney

(57) ABSTRACT

A current-feedback amplifier with at least one feed-forward capacitor at the input stage of the current-feedback amplifier is provided. In one embodiment, the current-feedback amplifier and feed-forward capacitor(s) are arranged as follows. The input stage includes two translinear loops, where each translinear loop includes a translinear element that is connected to the non-inverting input of the current-feedback amplifier. One feed-forward capacitor is in parallel with each translinear element that is connected to the non-inverting input of the current-feedback amplifier. In other embodiments, the feed forward capacitor(s) are arranged in a different manner.

13 Claims, 8 Drawing Sheets

APPARATUS AND METHOD FOR FEED-FORWARDING IN A CURRENT-FEEDBACK AMPLIFIER

FIELD OF THE INVENTION

The invention is related to current-feedback amplifiers, and in particular, to an apparatus and method of a current-feedback amplifier with at least one feed-forward capacitor.

BACKGROUND OF THE INVENTION

Traditional operational amplifiers use voltage feedback. However, a current-feedback amplifier (CFB) typically has significant bandwidth and slew rate advantages over conventional amplifiers.

With a voltage feedback amplifier (VFA) in a closed loop, the error signal is a voltage. A VFA ideally has high impedance inputs, to achieve substantially zero input current, and employs voltage feedback to maintain approximately zero differential input voltage.

In a CFB in a closed loop, the error signal is a current. A CFB ideally has one high impedance input and one low impedance input. Typically, a buffer is used to force the low impedance input to have a voltage equal to the input voltage at the high impedance input plus a voltage offset. A CFB in a closed loop employs current feedback to maintain low error current at the low impedance input.

BRIEF DESCRIPTION OF THE DRAWINGS

Non-limiting and non-exhaustive embodiments of the present invention are described with reference to the following drawings, in which.

DETAILED DESCRIPTION

Figure 1:
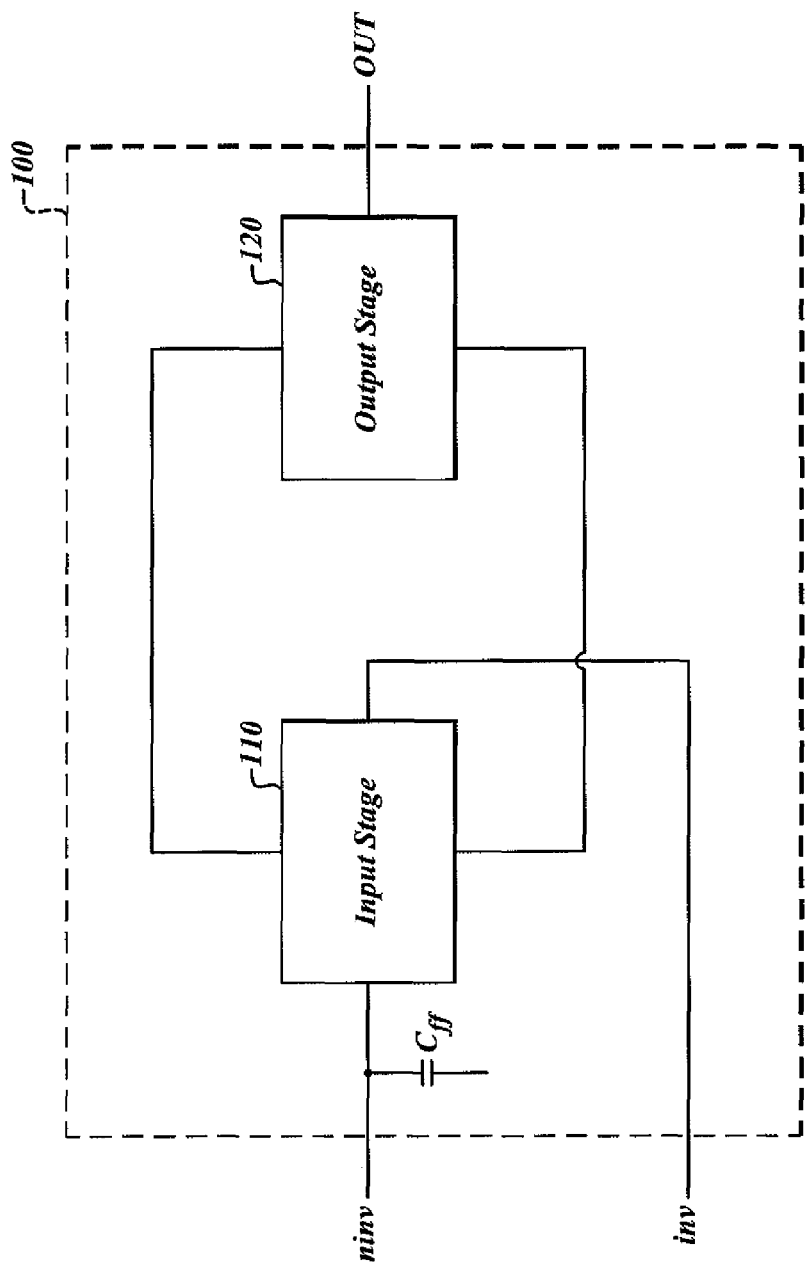
FIG. 1 shows a block diagram of an embodiment of a current-feedback amplifier.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a current-feedback amplifier with at least one feed-forward capacitor at the input stage of the current-feedback amplifier. In one embodiment, the current-feedback amplifier and feed-forward capacitor(s) are arranged as follows. The input stage includes two translinear loops, where each translinear loop includes a translinear element that is connected to the non-inverting input of the current-feedback amplifier. One feedforward capacitor is in parallel with each translinear element that is connected to the non-inverting input of the current-feedback amplifier. In other embodiments, the feedback-forward capacitor(s) are arranged in a different manner.

FIG. 1 shows a block diagram of an embodiment of current-feedback amplifier (CFB) 100. CFB 100 includes input stage 110, output stage 120, and feed-forward capacitor Cff. CFB 110 has a non-inverting input that receives non-inverting input signal ninv, an inverting input that receives inverting input signal inv, and an output that provides output signal OUT. Input stage 110 is an input buffer that is arranged to perform voltage buffering to provide inverting input signal inv from non-inverting input signal ninv. Output stage 120 is typically arranged to mirror current from the input stage (e.g. the collector currents) to a gain node to provide transimpedance stage, and to buffer the gain node voltage to provide output signal OUT of CFB 110. However, other topologies for a current-feedback amplifier for output stage 120 may also be employed.

Feed-forward capacitor Cff is coupled to the non-inverting input of current feedback amplifier 110, and is arranged in a feed-forward configuration with input stage 110. FIG. 1 only shows one connection of feed-forward capacitor Cff. One end of capacitor Cff is shown as connected to the non-inverting input of CFB 100, and the other end is not shown with a connection. This does not mean that the other end of capacitor Cff is floating. Rather, it means that the other end of capacitor Cff is connected in different places in different embodiments. Some embodiments are illustrated in the figures that follow.

Figure 2:
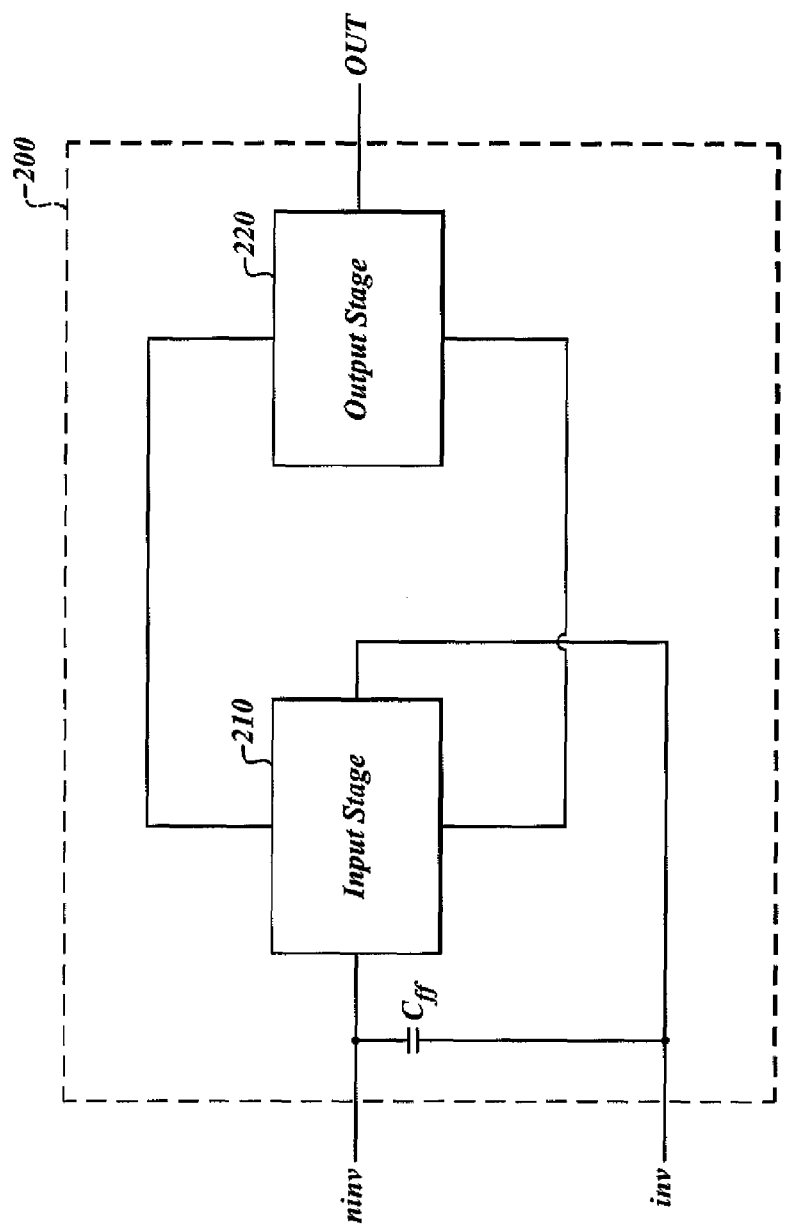
FIG. 2 illustrates a block diagram of an embodiment of the current-feedback amplifier of FIG. 1.

FIG. 2 illustrates a block diagram of an embodiment of current-feedback amplifier (CFB) 200, which may be employed as an embodiment of CFB 100 of FIG. 1. In CFB 100, feed forward capacitor Cff is coupled between the non-inverting input and the inverting input of CFB 200.

Figure 3:
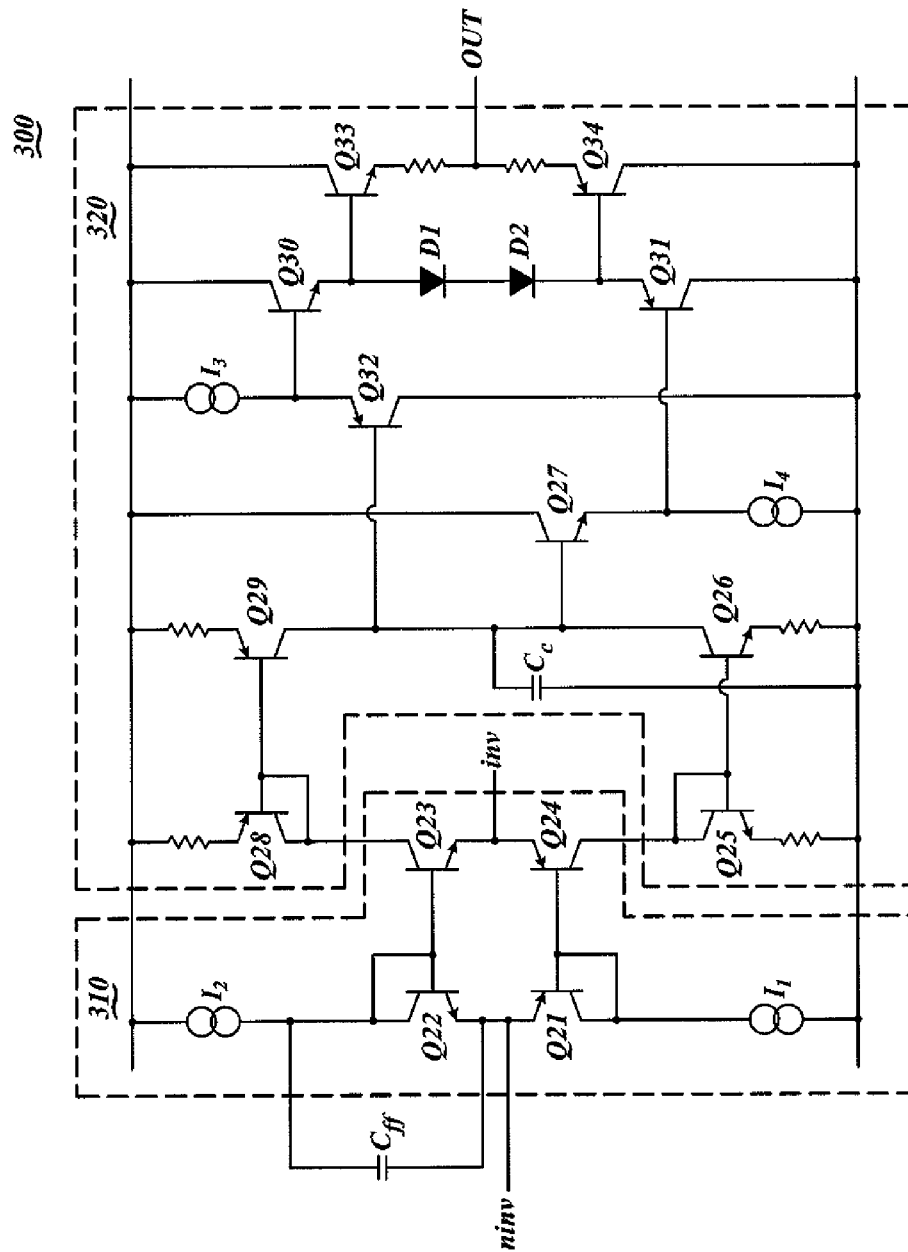
FIG. 3 shows a schematic diagram of another embodiment of the current-feedback amplifier of FIG. 1.

FIG. 3 shows a schematic diagram of an embodiment of current-feedback amplifier (CFB) 300, which may be employed as an embodiment of CFB 100 of FIG. 1. Input stage 310 includes transistors Q21-Q24, and current sources I1 and I2. One embodiment of output stage 320 includes transistor Q25-Q34, current sources I3 and I4, diodes D1 and D2, compensation capacitor Cc, and resistors (unlabeled).

Input stage 310 is a voltage buffer. Further, input stage 310 includes two translinear loops. One translinear loop is formed by the base-emitter junction of transistor Q22 and the base-emitter junction of transistor Q23. The other translinear loop is formed by the base-emitter junction of transistor Q21 and the base-emitter junction of transistor Q24. Each base-emitter junction is a separate translinear element. Transistors Q21 and Q22 are each arranged in a diode configuration.

In the embodiment shown, feed-forward capacitor Cff is in parallel with the base-emitter junction of transistor Q22.

Output stage 320 is arranged to operate as follows in the embodiment shown. Current mirror Q28/Q29 is arranged to mirror the collector current of transistor Q23 to the gain node at the collector of transistor Q29. Similarly, current mirror Q25/Q26 is arranged to mirror the collector current of transistor Q24 to the gain node. Additionally, compensation capacitor Cc is connected to the gain node. Output stage 320 also includes a buffer that is arranged to provide output voltage OUT by buffering the voltage at the gain node.

Figure 4:
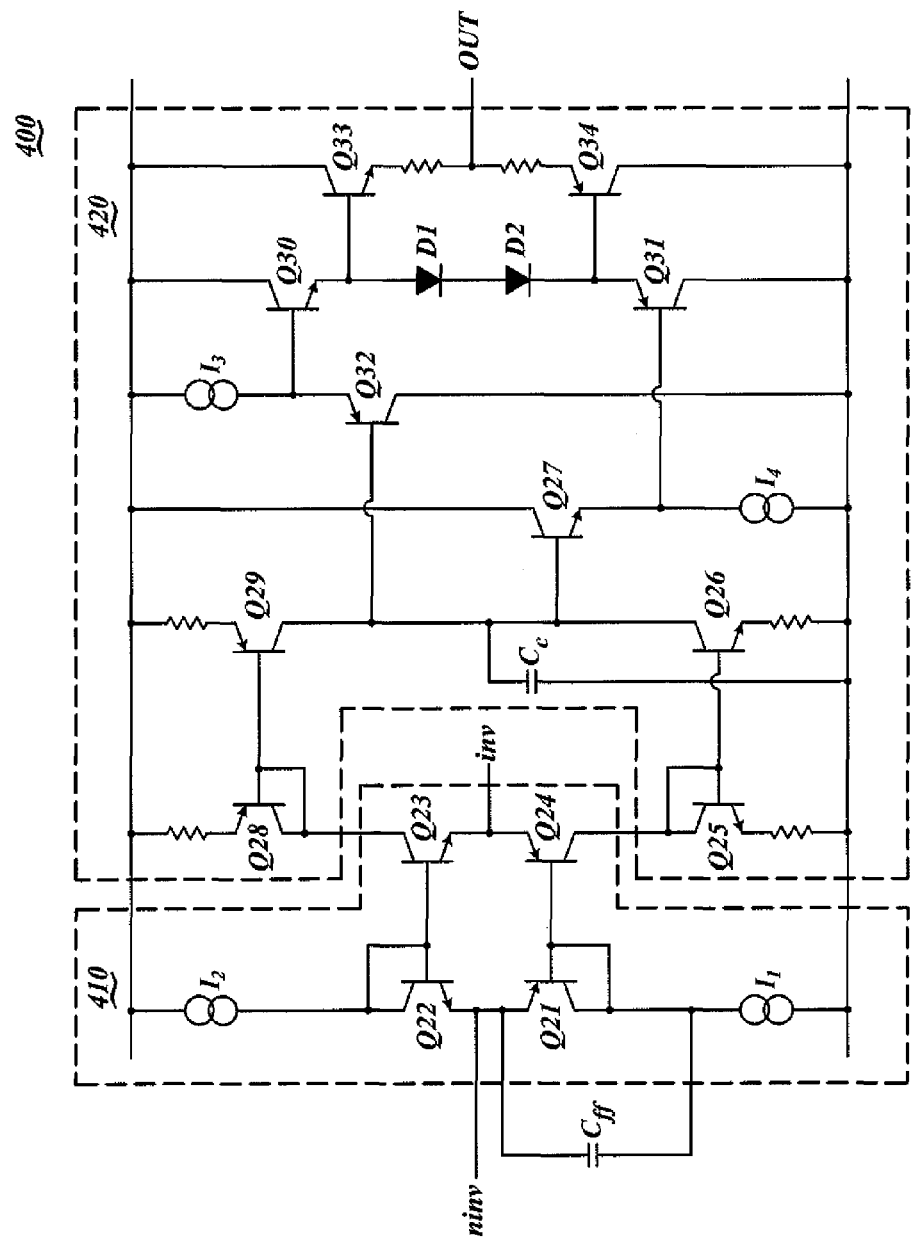
FIG. 4 schematically illustrates yet another embodiment of the current-feedback amplifier of FIG. 1.

FIG. 4 shows a schematic diagram of an embodiment of current-feedback amplifier (CFB) 400, which may be employed as an embodiment of CFB 100 of FIG. 1. CFB 400 is substantially similar to CFB 300 of FIG. 3, except for feed-forward capacitor Cff. In CFB 400, feed-forward capacitor Cff is in parallel with the base-emitter junction of transistor Q21 rather than transistor Q22.

Figure 5:
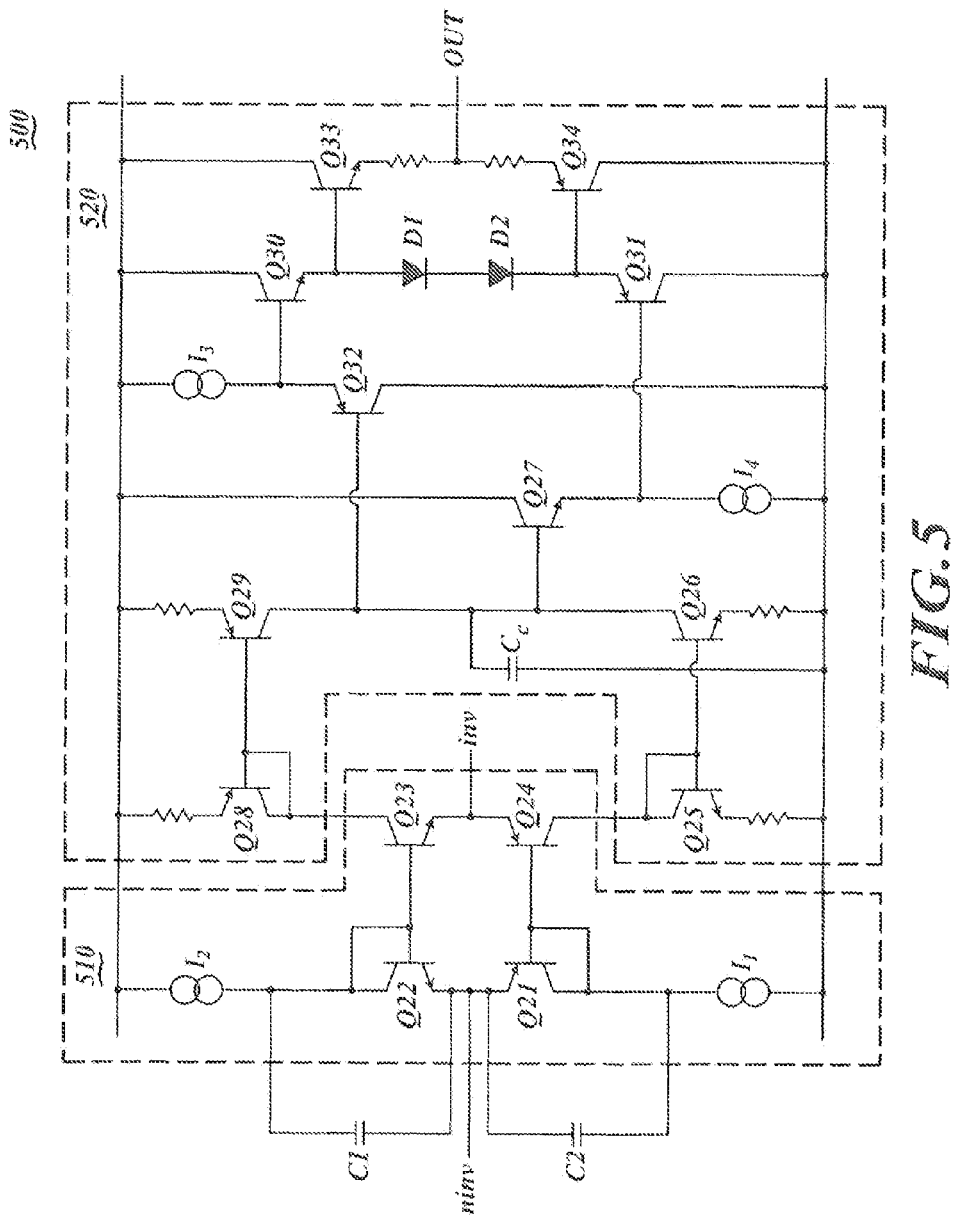
FIG. 5 schematically illustrates still another embodiment of the current-feedback amplifier of FIG. 1.

FIG. 5 shows a schematic diagram of another embodiment of current-feedback amplifier (CFB) 500, which may be employed as an embodiment of CFB 100 of FIG. 1. CFB 500 is substantially similar to CFB 300 of FIG. 3 and CFB 400 of FIG. 4, except that CFB 500 has two feed-forward capacitors (C1 and C2), instead of one. In one embodiment, C1 and C2 each have a capacitance of approximately 4 pF.

Several different configurations for a feed-forward capacitor or capacitors have been illustrated above. As illustrated in FIG. 2, in one embodiment, the feed-forward capacitor may be placed in between the non-inverting input of the CFB and the inverting input of the CFB. In other embodiments, a feedback-forward capacitor may be placed in parallel with either or both of the translinear elements that are connected to the non-inverting input of the CFB.

Including both feed-forward capacitors C1 and C2 improves the slew-rate of the CFB, in a non-inverting configuration, for both the falling and rising edges. Using one of the two feed-forward capacitors C1 and C2 improves the slew rate for one of the edges, but not both.

Figure 6:
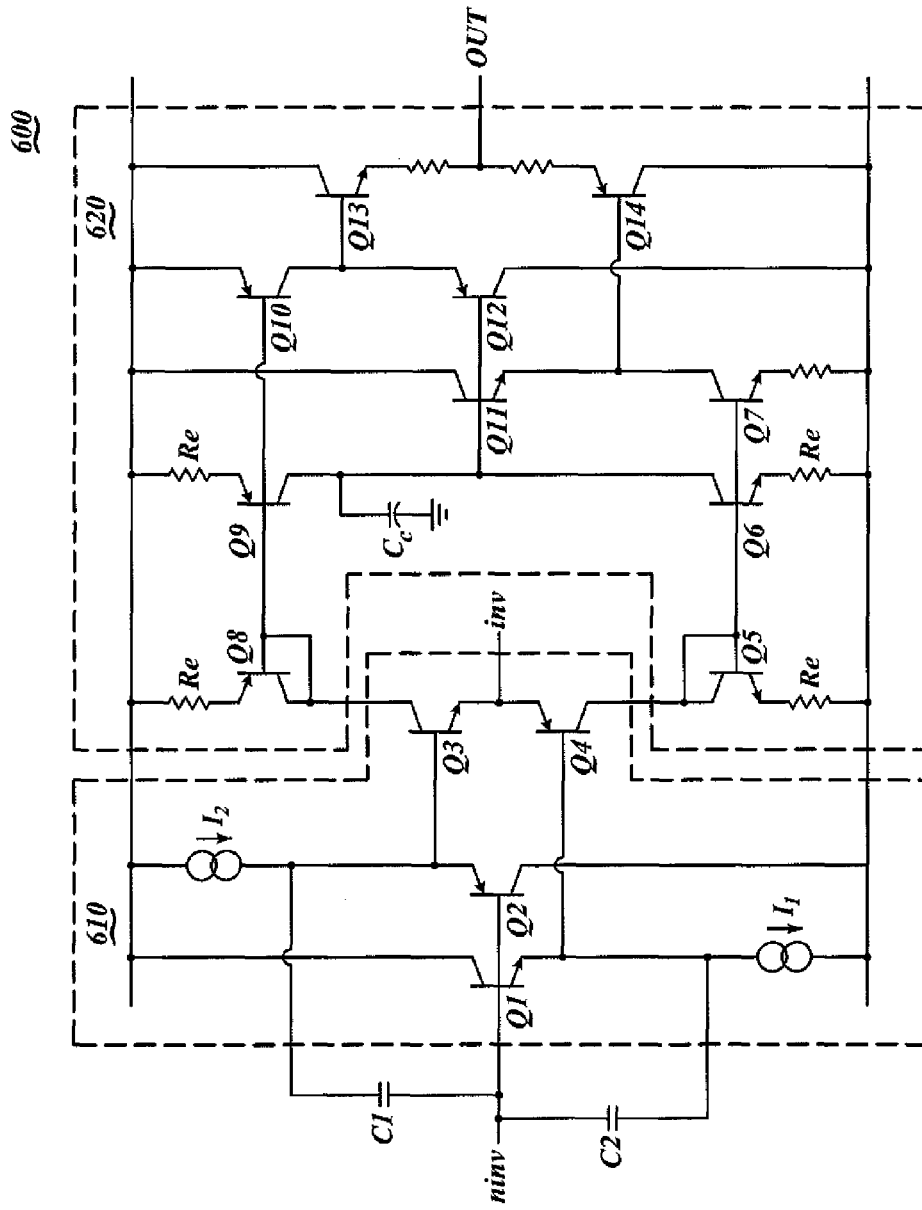
FIG. 6 schematically illustrates still yet another embodiment of the current-feedback amplifier of FIG. 1.

FIG. 6 shows a schematic diagram of an embodiment of current-feedback amplifier (CFB) 600, which may be employed as an embodiment of CFB 100 of FIG. 1. CFB 600 is similar to CFB 500, but the CFB topology is slightly different. In CFB 600, the two feed-forward capacitors (C1 and C2) are each in parallel with one of the translinear elements that is connected to the non-inverting input of the CFB. In CFB 500, feed-forward capacitor C1 is in parallel with the base-emitter junction of transistor Q2, and feed-forward capacitor C2 is in parallel with the base-emitter junction of transistor Q1.

Figure 7:
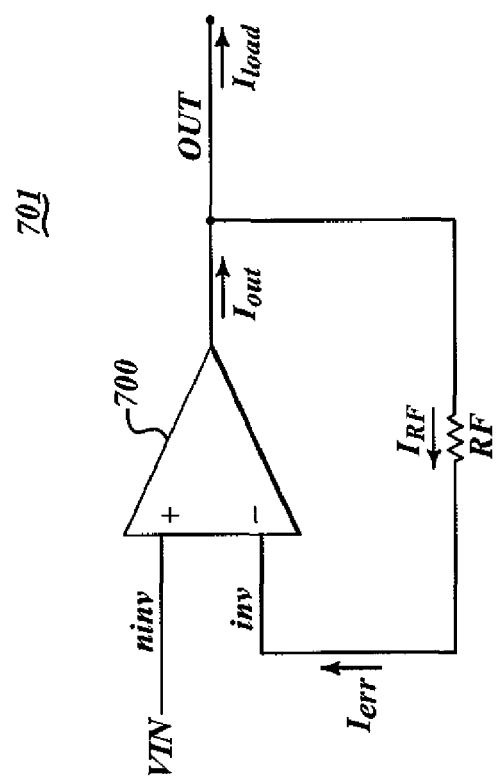
FIG. 7 illustrates a block diagram of an embodiment of the current-feedback amplifier of FIG. 1 in a non-inverting arrangement with a gain of one.

FIG. 7 illustrates a block diagram of an embodiment of amplifier 701, which includes a current-feedback amplifier (700) in a non-inverting amplifier configuration with a gain of one. Amplifier 701 includes CFB 700, which is an embodiment of CFB 100 of FIG. 1. Amplifier 701 further includes resistor RF.

Figure 8:
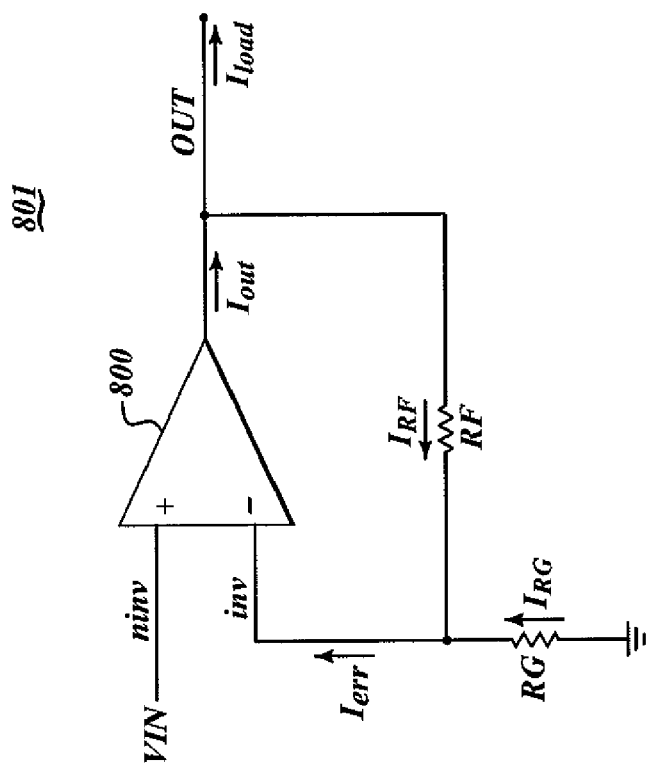
FIG. 8 shows a block diagram of an embodiment of the current-feedback amplifier of FIG. 1 in a non-inverting arrangement with a gain greater than one, arranged in accordance with aspects of the invention.

FIG. 8 illustrates a block diagram of an embodiment of amplifier 801, which is an embodiment of amplifier 701 of FIG. 1. Amplifier 801 further includes resistor RG. Amplifier 801 has a gain of 1+RF/RG.

The voltage at inv is substantially equal to the voltage at ninv, since the voltage at inv is provided by buffering the voltage at ninv. Accordingly, current $I_{RG}$ is substantially given by VIN/$R_G$. Since the feedback operation of non-inverting amplifier 801 causes the error current to become relatively small, voltage OUT is substantially given by VIN* (1+[$R_F$/$R_G$]).

The feed-forward capacitors, such as feed-forward capacitor C1 and C2 of FIG. 5, significantly increase the slew rate of the CFB during the non-inverting configuration operation, especially at low gain condition, such as a gain of 1 (as illustrated in FIG. 7). The feed-forward capacitor also significantly reduces the power dissipation.

If feed-forward capacitors are not included in the CFB, then, in the non-inverting configuration, when non-inverting input signal ninv is switching, the buffered voltage appearing at inv is limited in slew rate by its current source, and its parasitic capacitance, which results in reduced current mirrored to the compensation capacitor Cc for the output slew rate. Accordingly, without feed-forward capacitor(s), the output voltage OUT follows the slew-limited response of signal inv. Accordingly, the output slew rate is limited by the input buffer slew rate. However, by including feed-forward capacitor(s), such as capacitors C1 and C2, the slew rate of the signal at inv is significantly increased. The feed-forward capacitors allow the generation of greater error current during the switching, which increases the slew rate. This eliminates the slew-limited behavior of the input buffer stage, even at low gain, since inv responds relatively quickly to changes in VIN. This can be accomplished without increasing the input buffer current.

The above specification, examples and data provide a description of the manufacture and use of the composition of the invention. Since many embodiments of the invention can be made without departing from the spirit and scope of the invention, the invention also resides in the claims hereinafter appended.

What is claimed is:
1. A circuit for amplification, comprising:
 a current-feedback amplifier, including:
  an input stage having at least an inverting input and a non-inverting input; and
  a feed-forward capacitor that is arranged in a feed-forward configuration with the input stage, wherein the feed-forward capacitor is coupled to the non-inverting input of the input stage, wherein
 the input stage includes:
  a first transistor that is arranged in a diode configuration, wherein the first transistor is connected between the non-inverting input of the input stage and a first node;
  a second transistor having at least a base, a collector, and an emitter, wherein the base of the second transistor is connected to the first node, and wherein the emitter of the second transistor is connected to the inverting input of the input stage;

a third transistor that is arranged in a diode configuration, wherein the third transistor is connected between the non-inverting input of the input stage and a second node; and a fourth transistor having at least a base, a collector, and an emitter, wherein the base of the fourth transistor is connected to the second node, the emitter of the fourth transistor is connected to the inverting input of the input stage, and wherein the feed-forward capacitor is connected in parallel with the first transistor.

2. The circuit of claim 1, wherein
the current-feedback amplifier has at least an output, and wherein the current-feedback amplifier further includes:
an output stage, including:
a first current mirror that is arranged to mirror a first current of the input stage to a gain node;
a second current mirror that is arranged to mirror a second current of the input stage to the gain node; and
a buffer that is arranged to provide an output voltage at the output of the current-feedback amplifier by buffering a gain node voltage at the gain node.

3. The circuit of claim 1, further comprising:
a resistor, wherein the current-feedback amplifier has at least an output, the resistor is coupled between the output of the current-feedback amplifier and the inverting input of the input stage, and wherein the current-feedback amplifier is arranged in a non-inverting amplifier configuration.

4. A circuit for amplification, comprising:
a current-feedback amplifier, including:
an input stage having at least an inverting input and a non-inverting input;
a feed-forward capacitor that is arranged in a feed-forward configuration with the input stage, wherein the feed-forward capacitor is coupled to the non-inverting input of the input stage; and
another feed-forward capacitor that is arranged in a feed-forward configuration with the input stage, wherein said another feed-forward capacitor is coupled to the non-inverting input of the input stage.

5. The circuit of claim 4, wherein
the feedforward capacitor is connected between the non-inverting input of the input stage and the inverting input of the input stage.

6. The circuit of claim 4, wherein
the input stage includes:
a first transistor that is arranged in a diode configuration, wherein the first transistor is connected between the non-inverting input of the input stage and a first node;
a second transistor having at least a base, a collector, and an emitter, wherein the base of the second transistor is connected to the first node, and wherein the emitter of the second transistor is connected to the inverting input of the input stage;
a third transistor that is arranged in a diode configuration, wherein the third transistor is connected between the non-inverting input of the input stage and a second node; and
a fourth transistor having at least a base, a collector, and an emitter, wherein the base of the fourth transistor is connected to the second node, the emitter of the fourth transistor is connected to the inverting input of the input stage, and wherein the feed-forward capacitor is connected in parallel with the first transistor.

7. The circuit of claim 4, wherein the feed-forward capacitor and said another feed-forward capacitor are arranged to significantly increase a slew rate of the current-feedback amplifier when the current-feedback amplifier is arranged in a non-inverting amplifier configuration.

8. The circuit of claim 4, wherein
the input stage includes:
a first transistor that is arranged in a diode configuration, wherein the first transistor is connected between the non-inverting input of the input stage and a first node;
a second transistor having at least a base, a collector, and an emitter, wherein the base of the second transistor is connected to the first node, and wherein the emitter of the second transistor is connected to the inverting input of the input stage;
a third transistor that is arranged in a diode configuration, wherein the third transistor is connected between the non-inverting input of the input stage and a second node;
a fourth transistor having at least a base, a collector, and an emitter, wherein the base of the fourth transistor is connected to the second node, the emitter of the fourth transistor is connected to the inverting input of the input stage, the feed-forward capacitor is connected in parallel with the first transistor, and wherein said another feed-forward capacitor is connected in parallel with the third transistor.

9. The circuit of claim 4, wherein
the input stage includes:
a first transistor having at least a base that is connected to the non-inverting input of the input stage, an emitter that is connected to a first node, and a collector;
a second transistor having at least a base that is connected to the non-inverting input, an emitter that is connected to a second node, and a collector;
a third transistor having at least a base that is connected to the first node, an emitter that is connected to the inverting input of the input stage, and a collector; and
a fourth transistor having at least a base that is connected to the second node, an emitter that is connected to the inverting input of the input stage, and a collector, wherein the feed-forward capacitor is connected between the non-inverting input of the input stage and the first node, and wherein said another feed-forward capacitor is connected between the non-inverting input of the input stage and the second node.

10. The circuit of claim 4, wherein
the input stage includes:
a first translinear loop that is coupled between the non-inverting input of the input stage and the inverting input of the input stage, wherein the first translinear loop includes a first translinear element and a second translinear element;
a second translinear loop that is coupled between the non-inverting input of the input stage and the inverting input of the input stage, wherein the second translinear loop includes a third translinear element and a fourth translinear element;
a first current source having at least an output that is coupled to the first translinear element; and
a second current source having at least an output that is coupled to the third translinear element, wherein the feed-forward capacitor is coupled between the non-inverting input of the input stage and the output of the first current source.

11. The circuit of claim 10, wherein
said another feed-forward capacitor is coupled between the non-inverting input of the input stage and the output of the second current source.

12. A circuit for amplification, comprising:
a current-feedback amplifier, including:
- an input stage having at least an inverting input and a non-inverting input; and
- a feed-forward capacitor that is arranged in a feed-forward configuration with the input stage, wherein the feed-forward capacitor is coupled to the non-inverting input of the input stage, wherein the input stage includes:
- a first translinear loop that is coupled between the non-inverting input of the input stage and the inverting input of the input stage, wherein the first translinear loop includes a first translinear element and a second translinear element, and wherein the first translinear element is connected to the non-inverting input of the input stage;
- a second translinear loop that is coupled between the non-inverting input of the input stage and the inverting input of the input stage, wherein the second translinear loop includes a third translinear element and a fourth translinear element, the third translinear element is connected to the non-inverting input of the input stage, and wherein the feed-forward capacitor is coupled in parallel with the first translinear element.

13. The circuit of claim 12, wherein
the current-feedback amplifier further includes:
- another feed-forward capacitor that is coupled in parallel with the third translinear element.

* * * * *